(12) United States Patent
S.

(10) Patent No.: US 12,324,270 B2
(45) Date of Patent: Jun. 3, 2025

(54) QUANTUM PHOTONIC ENERGY STORAGE CELL AND MANUFACTURING METHODS THEREOF

(71) Applicant: Ostendo Technologies, Inc., Carlsbad, CA (US)

(72) Inventor: El-Ghoroury Hussein S., Carlsbad, CA (US)

(\*) Notice: Subject to any disclaimer, the term of this patent is extended or adjusted under 35 U.S.C. 154(b) by 0 days.

(21) Appl. No.: 18/223,482

(22) Filed: Jul. 18, 2023

(65) Prior Publication Data

US 2024/0021746 A1    Jan. 18, 2024

Related U.S. Application Data

(60) Provisional application No. 63/390,165, filed on Jul. 18, 2022.

(51) Int. Cl.
| | |
|---|---|
| *H10F 77/90* | (2025.01) |
| *H10F 10/14* | (2025.01) |
| *H10F 55/255* | (2025.01) |
| *H10F 77/122* | (2025.01) |
| *H10F 77/14* | (2025.01) |
| *H10F 77/42* | (2025.01) |

(52) U.S. Cl.
CPC ............ *H10F 77/90* (2025.01); *H10F 10/14* (2025.01); *H10F 55/255* (2025.01); *H10F 77/122* (2025.01); *H10F 77/143* (2025.01); *H10F 77/488* (2025.01)

(58) Field of Classification Search
CPC .......... H01L 31/028; H01L 31/035209; H01L 31/053; H01L 31/0547; H01L 31/068; H01L 31/173; H10F 77/90; H10F 77/122; H10F 77/143; H10F 77/488; H10F 10/14; H10F 55/255
See application file for complete search history.

(56) References Cited

U.S. PATENT DOCUMENTS

| | | | | |
|---|---|---|---|---|
| 5,710,436 A | * | 1/1998 | Tanamoto | B82Y 10/00 257/17 |
| 2009/0195961 A1 | * | 8/2009 | Eisenring | H01G 9/07 361/311 |
| 2013/0224596 A1 | * | 8/2013 | Nakazawa | H01M 14/00 429/231 |
| 2018/0175293 A1 | * | 6/2018 | Ogasawara | H01M 10/05 |
| 2020/0028012 A1 | * | 1/2020 | Regan | H02J 7/35 |

\* cited by examiner

*Primary Examiner* — Mayla Gonzalez Ramos
(74) *Attorney, Agent, or Firm* — W. Eric Boyd, Esq.

(57) ABSTRACT

Energy storage device comprising multiple solid state dielectric layers that can be used for high density electrical energy storage.

1 Claim, 12 Drawing Sheets

QUANTUM PHOTONIC ENERGY STORAGE CELL AND MANUFACTURING METHODS THEREOF

RELATED APPLICATIONS

This non-provisional application claims the benefit under 35 U.S.C. § 119(e) of U.S. Provisional Patent Application No. 63/390,165, filed Jul. 18, 2022, entitled "Quantum Photonic Energy Cell (QPEC)", the entire contents of which are incorporated herein by reference.

FIELD OF THE INVENTION

The present invention relates to energy storage devices comprising multiple solid state dielectric layers that can be used for high density electrical energy storage.

BACKGROUND

High density electrical energy storage devices are poised to become the next widely used energy storage devices that would enable reduced dependance on fossil fuel and consequently reduce their adverse impact on the environment. It's well known that, despite the recent progress in battery technology, the energy density gap between fossil fuels and current energy storage devices, such as Lithium-Ion batteries, as an example of best-in-class battery, is rather wide. As a result, the effort to reduce the demand on the use of fossil fuel is hampered by the wide gap in energy density between fossil fuels and current energy storage devices, herein referred to as the "energy density gap". Any meaningful progress to reduce the dependance and demand on fossil fuel and consequently reduce their adverse impact on the environment will have to be focused on ways to reduce the wide energy density gap between fossil fuels and energy storage devices.

Several research and development efforts are aiming to close that energy density gap. For example, the continuing effort to improve the energy density of Lithium-Ion batteries, including Lithium-Ion super capacitors, Lithium-Air batteries, and solid-state capacitors, still does not increase the energy density of these energy storage devices by enough to make a noticeable decrease in the energy density gap. Currently the best-in-class energy storage devices' energy density is less than 5% of the energy density, both volumetric and gravimetric, of fossil fuels. To make an impact, energy storage devices energy density must improve by at least one order of magnitude.

To achieve such an ambitious objective, different materials and different approaches for using such materials would need to be assessed and seriously considered for use in energy storage devices. A key factor besides energy density is cost. Any material considered must be cost-effective both in terms of raw material as well as manufacturing costs, and competitive, using the same cost metric of $/KW, with fossil fuel. A material that meets these criteria is silicon (Si-14). It's well known that silicon is the most abundant material on earth and is most likely also the most understood and most widely manufactured material on earth. As a semiconductor, silicon has a relatively high dielectric constant of 11.9, which makes it a good candidate as an energy storing capacitance. Because of its low indirect bandgap energy of 1.12 eV, silicon can be readily ionized by the full spectrum of light wavelengths greater than the infrared wavelength, which presents an opportunity for a nonconventional method of ionization in energy storage. In typical energy storage devices, such as capacitors, the energy storing mechanism is polarization of the energy storage device core material. In both batteries and super capacitors energy storage devices, the inclusion of an electrolyte introduces ionization as the mechanism for storing energy. In most all cases, the electrolyte used is either liquid or gel form, which in addition to added bulkiness, introduces the added problem of possible leakage of the electrolyte from the device package. In energy storage capacitors, the charge electric field provides the energy source that is converted into a polarization field for storage. In the case of devices that make use of ionization to store energy, including Lithium-Air batteries, the charge electric field provides the energy source that ionizes the core electrolyte for the storage of its energy. It is noted that most directly ionizable materials, including lithium, have low density, which represent a disadvantage in terms of their resultant energy density. Using silicon as an energy storage core material presents an advantage in terms of energy density since it is 4.36 times denser than lithium with a relatively high atomic density of $5 \times 10^{22}$ atom/cm$^3$, which would offer high ions density when ionized. The needed innovation is a practical approach to ionize silicon using the charge energy to create a viable energy storage device. Several advantages would be offered by such an energy storage device: (1) it could offer energy density that would bridge the energy density gap between fossil fuel and current energy storage devices such as batteries and capacitors, (2) when combined with the recent high energy density electric motors, the combination could offer overall system efficiency that is substantially higher than both fossil fuel in combination with an internal combustion engine (ICE) as well as lithium-ion batteries in combination with a high density electric motor, (3) it would be safer to use than fossil fuel or lithium-ion because it is noncombustible, (4) unlike lithium-ion batteries, it could be charged much quicker, (5) it could possibly be more cost-effective than lithium-ion (7.6 Wh/$ or $132/KWh) and possibly competitive with fossil fuel cost in $/KWh metric, (6) it could usher in a new era of advances in wearable and mobile devices that would be far more functionally capable while being less bulky and operate much longer on a single charge; (7) it could define a new horizon for electric vehicles in terms of range and operational efficiency; (8) it could usher the era of electric aircrafts, and (9) it could possibly alleviate the green-house gasses emission problem and its devastating impact on the environment.

Additional objectives and advantages of embodiments of this invention will become apparent from the following detailed description of embodiments thereof that proceeds with reference to the accompanying drawings.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION OF THE INVENTION

Figure 1A:
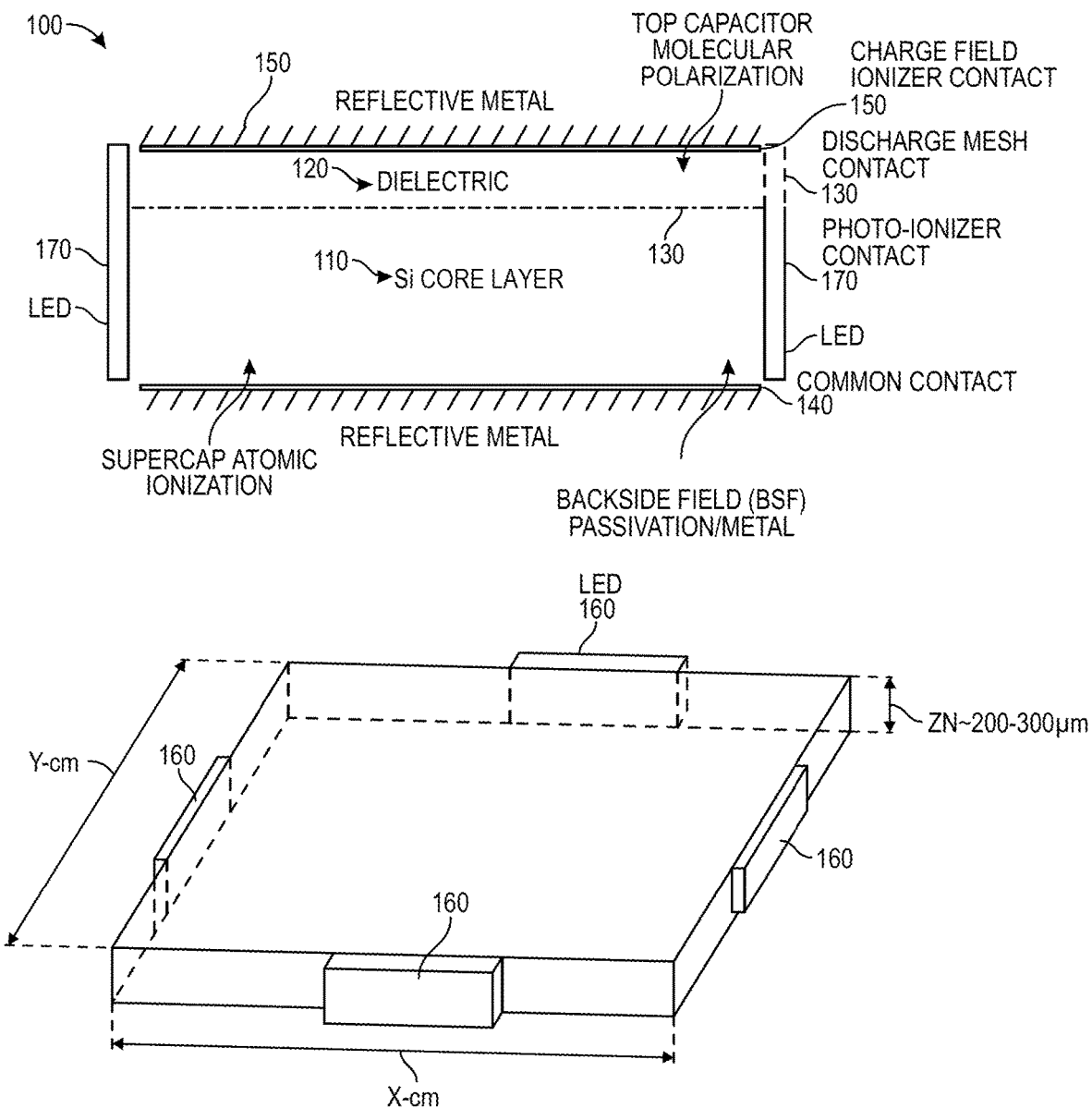
FIG. 1A illustrates an exemplary cross-sectional view of the Quantum Photonic Energy Storage Cell (QPEC) according to embodiments of this invention.

FIG. 1A illustrates an exemplary structure of the Quantum Photonic Energy Storage Cell 100, referred to herein as the QPEC, according to embodiments of this invention. FIG. 1A illustrates a cross-sectional view of the exemplary structure of the QPEC 100. As illustrated in FIG. 1A, the QPEC is a multi-layer structure that comprises a core layer 110 preferably composed of monocrystalline Silicon (Si) of thickness ranging from 100 to 300 microns depending on the range of design requirements of the QPEC 100, as illustrated in the design example described below. A thin cap layer 120 of highly crystalline wide band-gap dielectric material is deposited at one side of the Si-core layer 110. The thickness of the cap layer 120, also referred to herein as the dielectric layer 120, is in the range from 20 to 50 nanometer depending on the range of design requirements of the QPEC 100, as illustrated in the design example described below. The selected dielectric material for the dielectric layer 120 preferably has a dielectric constant, designated as a, that is higher in value than the dielectric constant of the Si-core layer 110. Furthermore, the selected dielectric material for the dielectric layer 120 preferably has a band-gap energy, designated as $E_g$, that is higher (or wider) in energy than the band-gap energy of the Si-core layer 110. An example dielectric material that meets both the dielectric constant α and band-gap energy $E_g$ design criterion is Silicon Nitride ($Si_3N_4$). The highly crystalline dielectric layer 120 is epitaxially deposited (grown) using either Atomic Layer Deposition (ALD) or Molecular Beam Epitaxy (MBA) deposition techniques at temperature in a range from 100° C. to 500° C.

Figure 1B:
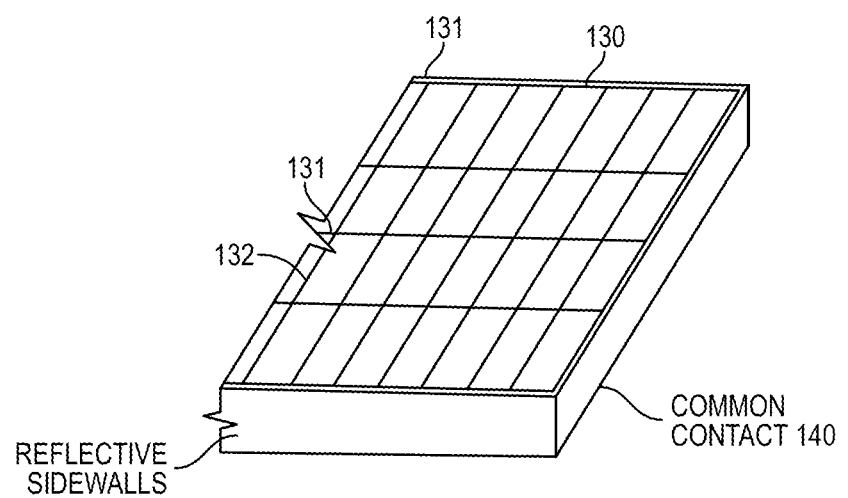
FIG. 1B illustrates an expanded view of a contact layer 130 of an exemplary Quantum Photonic Energy Storage Cell (QPEC) according to one embodiment of this invention.

As illustrated in the cross-sectional view of FIG. 1A, a contact layer 130, for example, a buried mesh contact layer 130, is interposed at the interface between the Si-core layer 110 and the dielectric layer 120. The isometric view of FIG. 1B provides an illustration of contact layer 130 comprising metal rails 131 interconnected by thinner (less wide) metal fingers 132. The width of the metal contact rails 131 and fingers 132 range from 50 to 75 microns, respectively. The spacing between the metal contact rails 131 of the contact layer 130 ranges from 2 to 5 centimeters and the spacing between the metal contact fingers 132 of the contact layer 130 ranges from 2-5 millimeters. The metal of the contact layer 130 rails 131 and fingers 132 is selected from a group of metals that can be defused into the Si-core layer 110 at high temperature, such as Copper (Cu-29) or Silver (Ag-47). The contact layer 130 rails 131 and fingers 132 are deposited on the top side of the Si-core layer 110, before the dielectric layer 120 is deposited, using conventional semiconductor manufacturing methods of Silicon lithography, etching and metal deposition, then annealed at high temperature in the range from 250° C. to 600° C. to defuse the deposited contact layer 130 rails 131 and fingers 132 into the lattice of the Si-Core layer 110 to a depth ranging from 20 to 50 microns. The diffusion depth of the deposited contact layer 130 rails 131 and fingers 132 into the lattice of the Si-Core layer 110 creates a volume for the contact layer 130 to extract the charge(d) carriers from the Si-Core layer 110. After the diffusion annealing step, the top side of the deposited contact layer 130 is polished to a high planarity specification of less than 0.5 nanometers using high planarity semiconductors chemical mechanical polishing (CMP) techniques. High planarity polishing of the deposited contact layer 130 is prerequisite for the subsequent deposition of the highly crystalline dielectric layer 120.

Figure 1C:
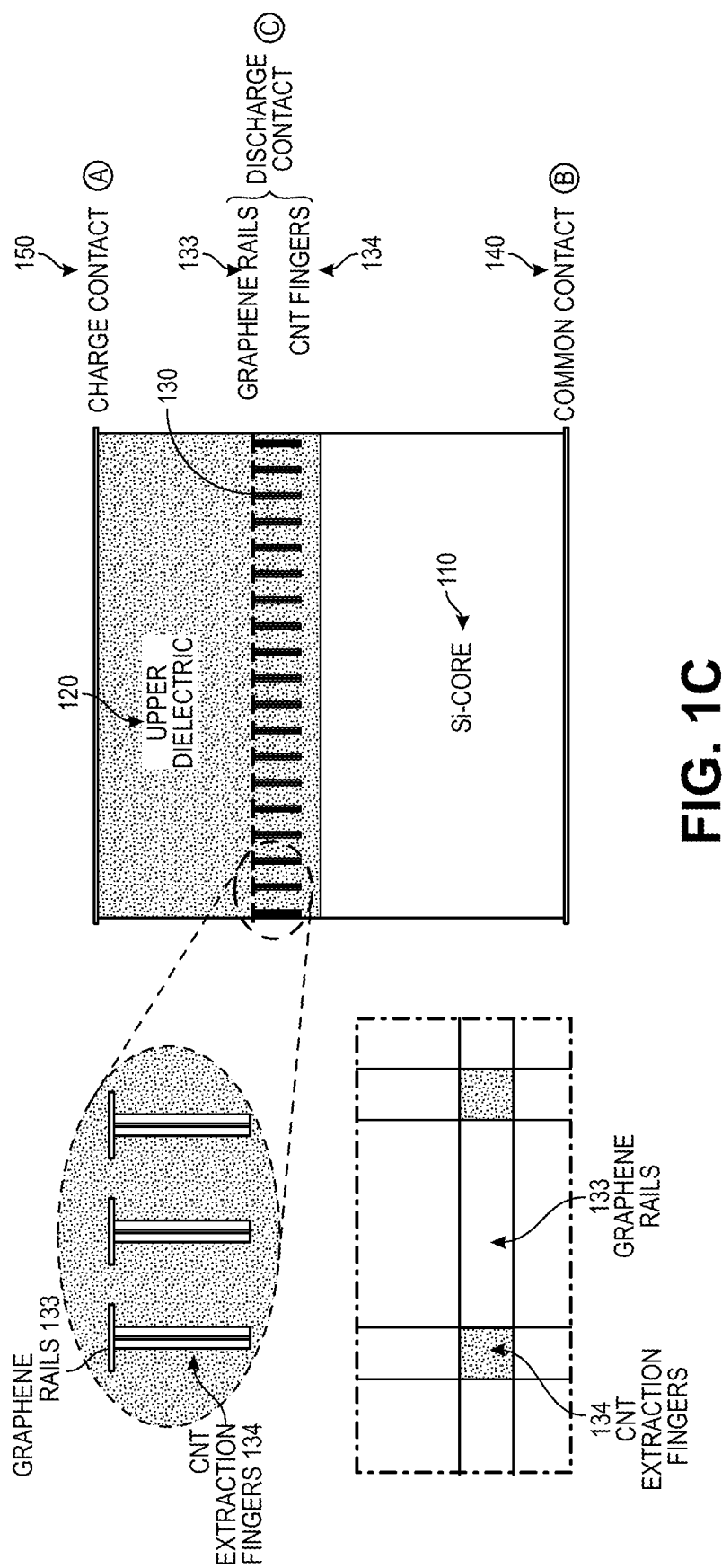
FIG. 1C illustrates an expanded view of a contact layer 130 of an exemplary Quantum Photonic Energy Storage Cell (QPEC) according to another embodiment of this invention.

In another embodiment, illustrated in FIG. 1C, the contact layer 130 is realized using graphene rails 133 and Carbon Nano-Tube (CNT) fingers 134 extending therefrom, diffused into the Si-Core layer 110. Graphene is a single layer (monolayer) of carbon atoms, tightly bound in a hexagonal honeycomb lattice. As illustrated in FIG. 1C, in this embodiment of the contact layer 130, graphene rails 133 are formed using lithographically patterned mono or multiple layer graphene deposited using Chemical Vapor Deposition (CVD). Carbon nanotubes (CNT) fingers 134 are formed using CVD, at high temperature in the range from 500° C. to 800° C., at the intersect points of the graphene rails 133. The CNT fingers 134 are diffused into the Si-core layer 110 to a depth ranging from 20 to 50 microns to form the charge(d) carriers' extraction volume of the contact layer 130. Because of the electromagnetic transparency of graphene, the graphene rails 133 can be formed as a continuous layer rather than a mesh formed of intersecting rails. Because of the highly crystalline properties of the continuous graphene rails 133, the continuous graphene rails 133 variant of this embodiment also serves as a deposition lattice surface for the highly crystalline dielectric layer 120.

According to embodiments, the graphene rails 133 transport charge carriers collected by the CNT fingers 134 to extraction rails at the boundary of a graphene layer. The electromagnetic porous properties of the graphene rails 133 and CNT fingers 134 allows the propagation of the electric field formed between the charge contact, i.e., the contact layer 150, and the common contact, i.e., contact layer 140.

The relatively deep penetration of the CNT fingers 134 into the Si-Core layer 110 creates an extraction region or volume through which the charge carriers are transported by the de-screened upper region field (i.e., the dielectric layer 120). The amount of charge carriers collected in extraction region volume is defined by the penetration depth of the CNT fingers through the Si-Core layer 110. The CNT fingers 134 penetration depth into the Si-Core layer 110 also defines the upper region field de screening volume since the charge carriers extracted through the CNT fingers 134 and graphene rails 133 create a de-screened field volume that extends across the penetration depth of the CNT fingers 134 into the Si-Core layer 110. The layer of graphene rails 133 comprise one or more monolayers of graphene as may be required by the charge carriers extraction current and resistance.

In addition to the contact layer 130, the QPEC structure illustrated in FIG. 1A has two metal contact layers, both preferably of Aluminum (Al), deposited at the Si-Core layer 110 and the dielectric layer 120 sides opposing the sides at which the contact layer 130 is interposed at the interface of these two layers. In FIG. 1A, the contact layer at the opposing Si-Core layer 110 side is designated as contact layer 140 and the contact layer at the opposing dielectric layer 120 side is designated as contact layer 150. Within the operational context of the QPEC, the contact layer 140 is used as a common contact while the contact layer 150 is used to apply the QPEC charge potential in reference to the common contact layer 140 and the contact layer 130 is used to extract charge carriers from the QPEC at a potential in reference to the common contact layer 140. Accordingly, contact layer 150 is designated as the "charge contact" and contact layer 130 is designated as the "discharge contact" with both potentials in reference to the common contact layer 140.

The QPEC is charged by the ionization and polarization effects of the combination of electric and photonic fields. Referring to FIG. 1A, the charge electric field is coupled onto the QPEC structure 100 across the common contact layer 140, for the low potential side of the coupled electric field, and the charge contact layer 150 for the high potential side of the coupled electric field. As illustrated in FIG. 1A, the charge photonic field is generated by a multiplicity of photo ionizing light emitting diodes (LEDs) 160 having their emissive apertures optically coupled to the edge of the QPEC structure 100. A fourth, LED, contact layer 170 of the QPEC 100 is electrically coupled to the multiplicity of LEDs 160 to supply their drive potential in reference to the common contact layer 140. The combined charge energy supplied to generate the electric field, coupled through contact layer 150, and to generate the photonic (light) field, coupled through the LEDs contact layer 170, makes the total charge energy supplied to the QPEC 100.

In one embodiment, the contact layers comprise reflective metal, and the light pumped by the photo ionizing LEDs 160 is recycled by the reflective contact layers.

In one embodiment, the LEDs 160 transmit light in the blue range of 450 nm or shorter.

In one embodiment, QPEC 100 has a width, x, in centimeters, a length, y, in centimeters, and a depth, z, in the range of 200-300 microns, wherein values of x and y are selected to ensure uniform photo ionization. Higher x and y values may require more LEDs coupled to one or more sides of QPEC 100.

The total charge energy supplied to the QPEC 100 through the electric and photonic fields is stored as ionization energy in the Si-Core layer 110 and as polarization energy in the dielectric layer 120. These two stored energy components are electrically aligned, hence additive and equal Combined, they balance the electric field energy coupled onto the QPEC structure 100 through the charge contact layer 150. At the initial stage of the charge process the electric field coupled between the common contact layer 140 and the charge contact 150 polarizes both the Si-Core layer 110 and the dielectric layer 120. Simultaneous with this initial stage polarization, the photonic field optically coupled onto the QPEC structure 100 ionizes the Si-Core layer 110 through a photoexcitation process that excites electrons from the Si-Core layer 110 material valence energy band (VB) across the narrow indirect bandgap (1.12 eV) of the Si-Core layer 110 material to its conduction energy band (CB). The free photoexcited electrons are accelerated by the coupled electrical field, i.e., gain energy from the coupled electrical field, scatter within the lattice of the Si-Core layer 110 material and excite additional electrons through a process known as "impact ionization". As the photonic fields and the electric fields charge processes progress, more of the Si-Core layer 110 material atoms become excited and are physically separated by the coupled electrical field into negative ions (anion) that are transported toward the contact layer 130 region and positive ions (cation) that are transported toward the common contact layer 140 region.

Besides storing part (about half) of the energy charged onto the QPEC structure 100, the dielectric layer 120 electrically decouples (isolates) the free charge carriers coupled onto the (charge) contact metal (Al) layer 150 to create the charge electric field from the ionized Si-Core layer 110 while its formed dipolar polarization field acts to "transpose" the (charge) electric field potential coupled onto the contact metal (Al) layer 150 to the interface between the dielectric layer 120 and the Si-Core layer 110. In effect, therefore, the dielectric layer 120 transposes the (charge) electric field coupled onto the contact metal (Al) layer 150 into a "stand-off" electrical field coupled onto the Si-Core layer 110 at the interface between the dielectric layer 120 and the Si-Core layer 110, where the contact layer 130 is physically located. The disclosed stand-off electrical field method of this embodiment provides energy storage capacitance while enabling the impact ionization effect on the Si-Core layer 110 without interference from the free charge carriers coupled onto the (charge) contact metal (Al) layer 150 to create the (charge) electrical field potential. Without the disclosed "stand-off" field method of this embodiment it would not be possible to couple the charge electrical field to realize the impact ionization effect onto the Si-Core layer 110. With the disclosed "stand-off" field method of this embodiment the Si-Core layer 110 negative ions (anion) created by the combined effects of the electro (impact) and photo ionizations processes are transported by the created stand-off field to the contact layer 130 region, without interacting with the free charge carriers coupled onto the charge contact metal (Al) layer 150.

Within the context of the QPEC structure 100, the photonic excitation field coupled onto the structure 100 from the multiplicity of LEDs 160 selectively photo ionize only the Si-Core layer 110, but not the dielectric layer 120, by first selecting the bandgap energy of the dielectric layer 120 to be larger (or wider) than the minimum indirect bandgap energy of the Si-Core layer 110 of 1.12 eV and second by the selecting the photonic field photons energy, which is empirically valued as $$E_p(\text{eV}) = \frac{1240}{\text{Photons Wavelength(nm)}},$$

to be greater than the Si-Core layer 110 material indirect bandgap energy of 1.12 eV and as close as possible in value to the Si-Core layer 110 material direct bandgap energy of 3.4 eV. With this design selection criteria, the coupled photonic field is only absorbed by the Si-Core layer 110 material and photoexcites its electrons to an energy level sufficient to excite other electrons by impact ionization after being accelerated by the coupled stand-off electric field, and greater than twice the value of the minimum indirect bandgap energy of the Si-Core layer 110. The stated design criteria for selective photo ionization of the Si-Core layer 110 requires the photonic field photons energy to be in the range from 2.24 eV to 3.4 eV, with associated wavelength in the range from 365 nm (UV) to 554 nm (G). In the design examples disclosed hereinbelow, the selected photo ionization field photons energy is 2.75 eV with associated wavelength of 450 nm, for which LED material is commercially widely available at cost-effective prices, which is another pertinent design criterion of the QPEC 100.

The term "polarization" is used herein to indicate the alignment of charges with the electric field coupled onto the QPEC structure 100 through the two metal contact layers 140 and 150. In the case of the material of the dielectric layer 120, the coupled electric field causes deformations of the atomic (electrons) orbitals of the material, which partially de-screens the positive electric charges of the atomic nucleus and creates charge dipoles. In this process the electrons of the dielectric layer 120 material remain in their bound orbitals with their energy levels within the valence band (VB). The term "polarization" in this case is meant to indicate the alignment of the formed dipoles with coupled electric field and are referred to herein as "dipolar polarization". However, the maintained bound state of the dielectric layer 120 material electrons prevents the interaction between the formed dipoles and the free charges of the metal contact layer 150—an effect that causes the electric field coupled onto the QPEC structure 100 to be a stand-off field relative to the dielectric layer 120. The opposing electric field created by the dielectric layer 120 dipolar polarization transposes the high potential side of the electric field coupled onto the QPEC structure 100 through the metal contact layer 150 to the interface between the dielectric layer 120 and the Si-Core layer 110 at the contact layer 130 region while maintaining electrical isolation between the metal contact layer 150 free electrons and the contact layer 130. This design aspect of the QPEC 100 is what extends the electric field coupled onto the QPEC structure 100 through the two metal contact layers 140 and 150 to also become a stand-off electric field relative to the Si-Core layer 110.

In the case of the material of Si-Core layer 110, the combined impact ionization and photonic ionization effects of the transposed electric field and the coupled photonic field, respectively, cause the fields' excited electrons to transfer from the Si-Core layer 110 material valence band (VB) to its conduction band (CB) and become "free" electrons that can also physically transport, within the conduction band (CB), across the lattice of the Si-Core layer 110 material. In this case an added effect of the coupled stand-off electric field is that the excited free electrons are also driven (or transported) by the coupled stand-off electric field towards the transposed high potential side of the field at the dielectric interface where the contact layer 130 is located. The transport process of the excited free electrons by the transposed electric field causes the Si-Core layer 110 atoms near the contact layer 130 region to accept the transported free electrons in their conduction band (CB), thus forming negative ions (or anions), while leaving behind the Si-Core layer 110 atoms missing the excited electrons, which form positive ions (or cations), concentrated at the common contact layer 140 region. The term "polarization" in this case is meant to indicate the transport of the formed Si-Core layer 110 ions and separation to the respective regions of the coupled stand-off electric field near the contact layer 130 and common contact layer 140, respectively, and this process is referred herein as "ionic polarization".

The ionic polarization process used in the QPEC 100 is vastly different than the process used in the most widely used battery, the lithium-ion battery, where anion (electrons) are fixed at the anode region while the much larger part of the ionized lithium atoms that forms the cations are transported, through a gel or liquid electrolyte, to the cathode region of the lithium-ion battery. As is well known, transporting the larger size ions during the ionic polarization of the lithium-ion battery represents its major weakness because it causes notable strain on the battery core material and results in subsequent adverse lifecycle impact on the battery performance. In comparison, the QPEC 100, in the ionic polarization process, the free electrons, which are much lighter and smaller than the silicon atom, are transported across the Si-Core layer 110 lattice atoms without the need for an electrolyte.

As a result of the QPEC 100 ionic polarization process, the formed Si-Core layer 110 ions are separated by the transposed stand-off electric field coupled onto the metal contact layers 140 and 150 to become electrically opposing and balancing the stand-off electric field with the negative ions (anions) at the side of the Si-Core layer 110 facing the dielectric layer 120, the contact layer 130 side, and the positive ions (cations) at the common contact layer 140 side. As the ionic polarization of the Si-Core layer 110 progresses during the charge process, a capacitance is formed by the Si-Core layer 110 un-ionized atoms separating the positive and negative ions of the Si-Core layer 110. The formed Si-Core layer 110 capacitance is configured electrically in parallel with the dielectric layer 120 capacitance, hence their polarization fields are opposing, and their capacitance is additive. Furthermore, the electrical balancing aspects of the formed Si-Core layer 110 and the dielectric layer 120 capacitances make the electrical energy stored in each of these two capacitances equal.

Thus, the QPEC charging mechanism comprises the following characteristics:
(1) Photo-ionizer LEDs 160 photoexcite charge carriers in the Si-Core layer 110;
(2) The electric field energizes the photoexcited charge carriers;
(3) The energized charge carriers excite more charge carriers by impact ionization (self-quenched avalanche effect);
(4) The combined photo+electric field ionizations charge the Si-Core layer 110 capacitance to the molecular level;
(5) Dielectric layer 120 is charged by dipolar polarization as charge carriers accumulate at the discharge contact, i.e., the contact layer 130; and
(6) Si-Core layer 110 and dielectric layer 120 capacitance are charged in opposite directions relative to the common contact layer 140.

Figure 2A:
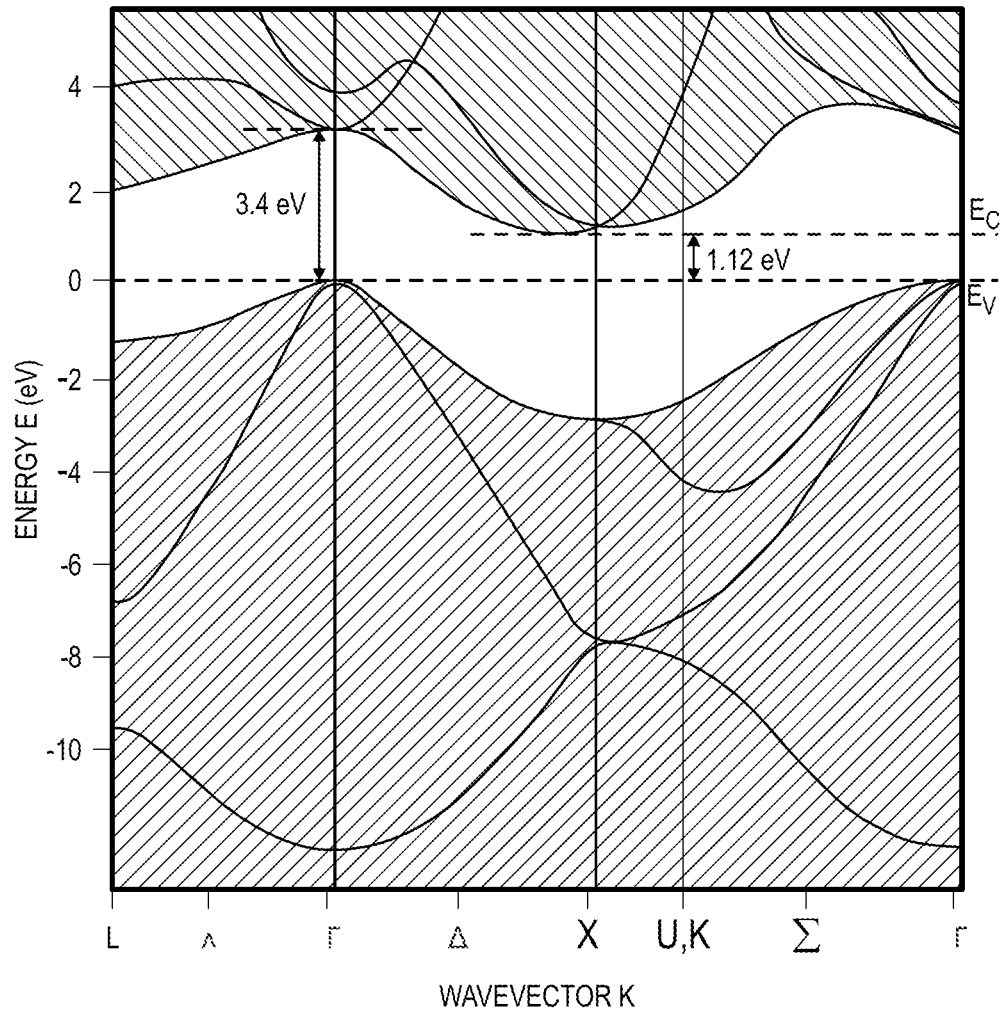
FIG. 2A illustrates the energy bandgap structure of the QPEC Si-Core material as a function of the wavevector k.

FIG. 2A illustrates the energy bandgap structure of the QPEC 100 Si-Core layer 110 material as a function of the wavevector k. As illustrated in FIG. 2A, the QPEC 100 Si-Core layer 110 material has a 1.12 eV indirect bandgap separating the valence band (VB) maximum energy level, along the $\Gamma$ symmetry point, and conduction band (CB) minimum energy level, along the X symmetry point. The QPEC 100 Si-Core layer 110 material also has a 3.4 eV direct bandgap separating the valence band (VB) and conduction band (CB) maximum energy levels, along the Γ symmetry point. The S-shape of the QPEC 100 Si-Core layer 110 material, as described hereinbelow, affects the impact ionization process. The impact ionization process involves electron scattering within the Si material lattice. Electron scattering within the SI material lattice involves exchange of potential energy as well as momentum that enables excited electrons to transition along both the energy E(eV) axis as well as the wavevector k axis. The photoexcitation of the QPEC 100 Si-Core layer 110 material by the light emission from the multiplicity the photo ionization LEDs 160 excites electrons from the VB to the CB across the minimum indirect bandgap, a process which also involves phonons scattering (lattice) to provide the needed momentum that enables the transition along the wavevector axis k needed to cross the indirect bandgap. The described QPEC 100 Si-Core layer 110 ionic polarization process also provides an added mechanism, besides the phonons scattering, for excited electrons scattering that enables electrons excitation across the Si-Core layer 110 material indirect bandgap. The described QPEC 100 Si-Core layer 110 ionic polarization process also provides a mechanism for excited electrons of QPEC 100 Si-Core layer 110 material to be accelerated while being transported by stand-off field effect and gain potential energy to transition across the energy axis of the energy bandgap structure of FIG. 2A. With these two mechanisms of excited electrons scatterings, the excited electrons undergo an ionization induced by an electron-lattice scattering process, known as "impact ionization".

Figure 2B:
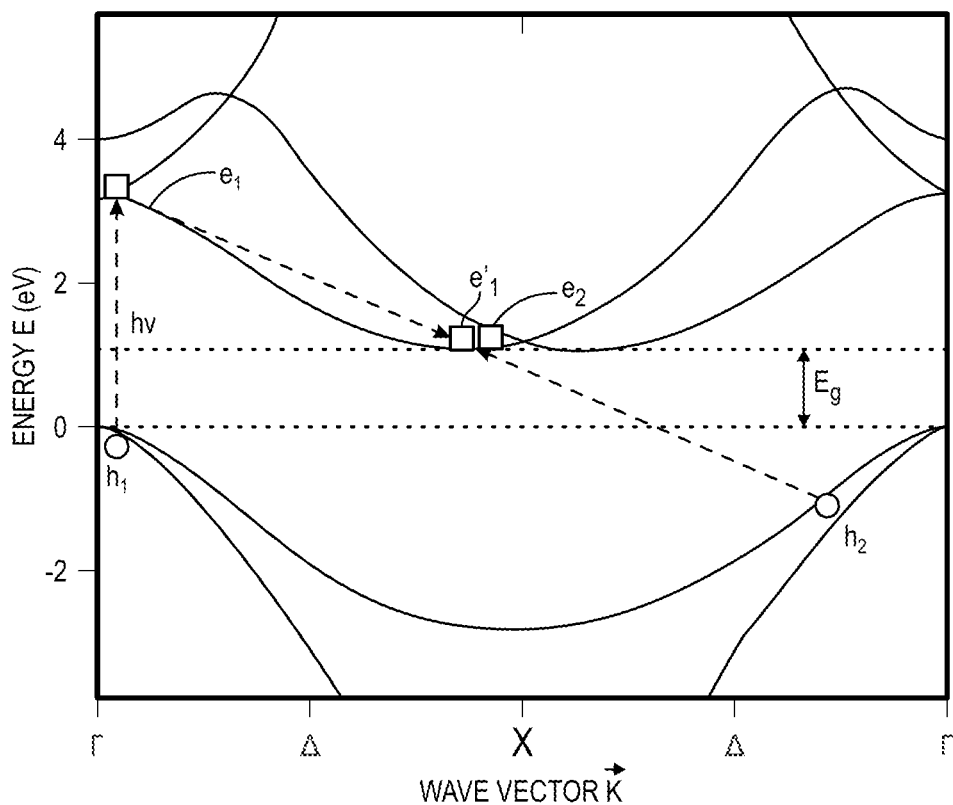
FIG. 2B illustrates the impact ionization process within the context of the energy bandgap structure of the QPEC 100 Si-Core layer 110 material of FIG. 2A.

FIG. 2B illustrates the impact ionization process within the context of the energy bandgap structure of the QPEC 100 Si-Core layer 110 material of FIG. 2A. FIG. 2B illustrates an excited electron $e_1$ that has potential energy in excess of twice the indirect bandgap energy ($2E_g=2.24$ eV), gained either by photoexcitation, the stand-off field effects described above or their combination, undergoing an impact ionization process during which the excited electron $e_1$ gives up its excess energy above twice the indirect bandgap energy ($2E_g=2.24$ eV) to excite another electron $e_2$ across the indirect bandgap energy $E_g$. With the described stand-off field effects, both the excited electrons $e_1$ and $e_2$ gain energy from the stand-off field and subsequently undergo another cycle of impact ionization process with each exciting an additional electron. This impact ionization chain reaction effect is known as "avalanche ionization", a process to which semiconductor material breakdown is attributed when the energy gained by the excited electrons from the electric field approaches the material first ionization energy level. For Si material the first ionization energy is 8.4 eV and inducing avalanche ionization by an electric field effect alone would require applied field potential that approaches the Si material breakdown field potential of 30 V per micron.

Figure 2C:
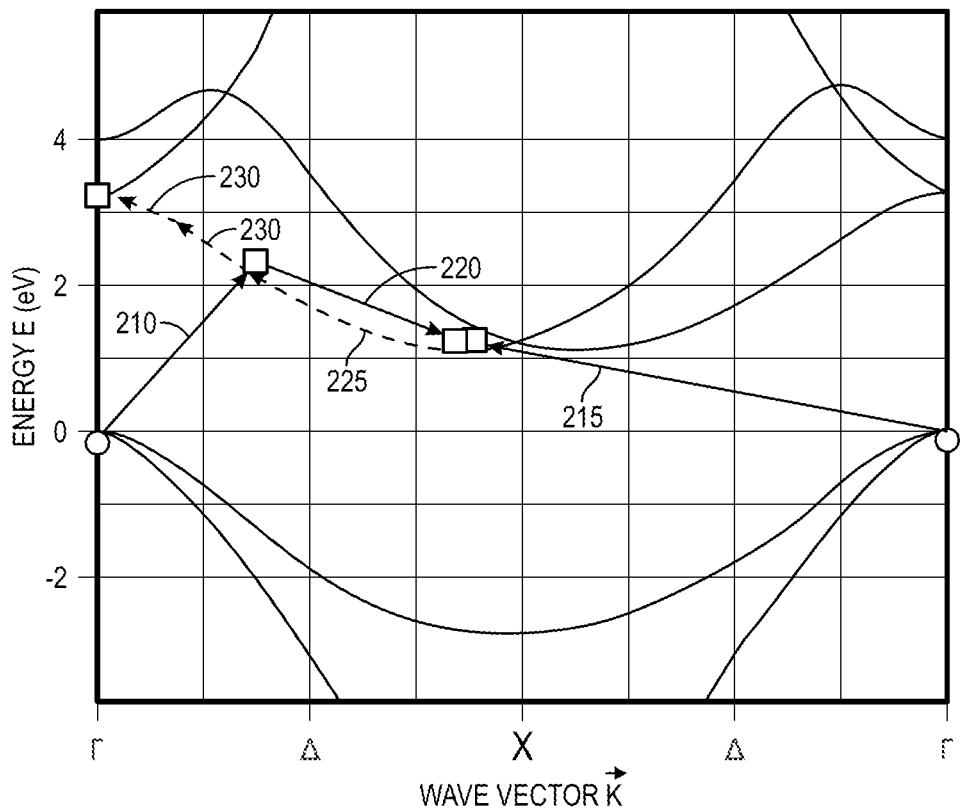
FIG. 2C illustrates the avalanche ionization process used to ionize the QPEC Si-Core material.
Figure 2D:
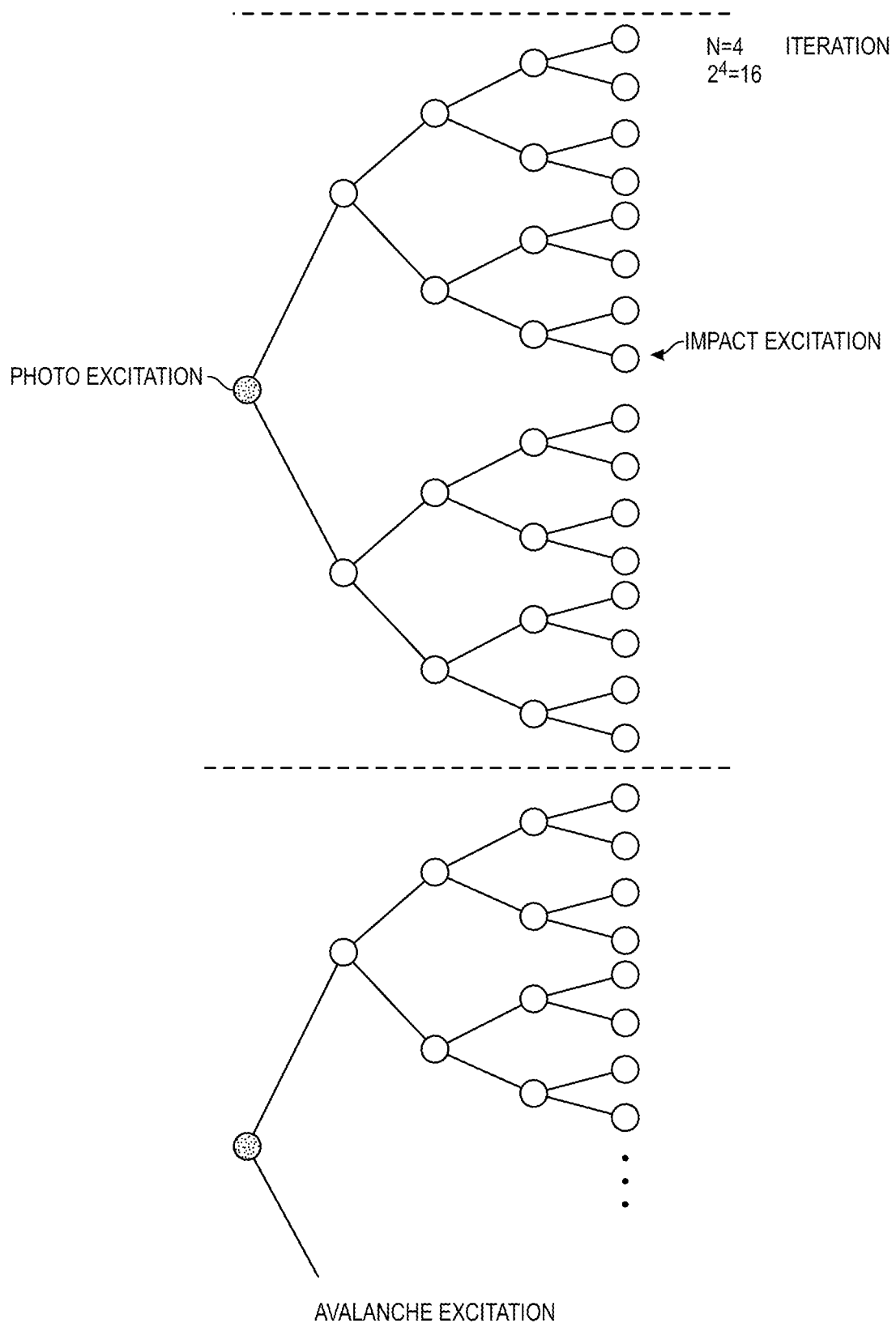
FIG. 2D illustrates the avalanche ionization chain reaction impact ionization created by the QPEC photo and electric fields excitations.

FIG. 2C illustrates the avalanche ionization process used to ionize the QPEC 100 Si-Core layer 110 material. Referring to FIG. 2C, the exemplary avalanche ionization process used to ionize the QPEC 100 Si-Core layer 110 material is seeded or induced by photonic excitation 210 generated by the optically coupled light emitted from the LEDs 160 having photons' energy hv greater than twice the indirect bandgap energy ($2E_g=2.24$ eV). The photoexcited electrons scatter with the Si-Core layer 110 material lattice, undergo the described impact ionization process of FIG. 2B, excite another electron 215 across the Si-Core layer 110 material direct bandgap to the conduction band minimum, then relax 220 to the conduction band minimum near the X symmetry point. The electrons generated by the impact ionization process gain energy 225 from the stand-off electric field, coupled through the metal contact layers 140 and 150, to reach the QPEC 100 Si-Core layer 110 material conduction band (CB) maximum across the Si-Core layer 110 material direct bandgap of 3.4 eV at the Γ symmetry point then undergo another cycle of impact ionization creating the avalanche ionization chain reaction illustrated in FIG. 2D. As illustrated in FIG. 2C, the holes created by the avalanche ionization process in the valence band (VB) gain energy 230 from the coupled stand-off field 230 to reach the QPEC 100 Si-Core layer 110 material valence band (VB) maximum across the Si-Core layer 110 material direct bandgap of 3.4 eV. As illustrated in FIG. 2C, since both potential energy and momentum are conserved during the process, the holes created by the avalanche ionization process in the valence band (VB) are located at the VB maximum when the impact ionization that generated the holes was initiated by electrons with potential energy that nearly exceeds twice the indirect bandgap energy ($2E_g=2.24$ eV). As the ionization density of the Si-Core 110 material increases by the impact ionization process, less unionized Si-Core 110 atoms become available for the excited electrons to scatter with, and the excited electrons 230 continue to gain potential energy from the coupled field to reach the QPEC 100 Si-Core 110 material conduction band (CB) maximum across the Si-Core 110 material direct bandgap of 3.4 eV at the Γ symmetry across from the holes accumulated at VB maximum. As the avalanche process continues, the exited electrons and holes accumulate across the Si-Core layer 110 material direct bandgap of 3.4 eV in their respective energy band maxima.

The foregoing explanation describes the ionic polarization process that results from the avalanche ionization process of the QPEC 100 in wavevector k energy space. The electrons and holes generated by the avalanche process are physically separated and transported across their respective sides of the stand-off electric field, coupled through the metal contact layers 140 and 150 of the QPEC 100 Si-Core layer 110 material, to form positive and negative ions, cations and anion, respectively. In effect, the avalanche ionization process of the QPEC 100 creates Si-Core layer 110 ions that are electrically aligned in an opposing direction of the coupled stand-off electric field, physically separated to their respective sides of the Si-Core layer 110 material, i.e., ionically polarized, and having 3.4 eV of potential separation that constitutes the created Si-Core layer 110 ions chemical potential, since the ions are aligned in the wavevector k energy space across the Si-Core layer 110 direct bandgap of 3.4 eV.

Besides the prerequisite requirements for the photoexcitation light generated by the LEDs 160 to have potential energy $E_p=h\upsilon$ in excess of twice the value of the Si-Core layer 110 indirect bandgap of $E_g=1.12$ eV, i.e., $E_p=h\upsilon >2.24$ eV, the avalanche ionization process of the QPEC 100 requires the stand-off field coupled through the metal contact layers 140 and 150 of the QPEC 100 to enable impact ionization process that further excites electrons in the Si-Core layer 110 material CB to: (1) potential energy in excess of twice the value of the Si-Core layer 110 indirect bandgap of $E_g=1.12$ eV, i.e., $E_g>2.24$ eV, and (2) momentum wavevector k aligned along the axis extending from the Γ to the X points, i.e., directed along the (100) Miller coordinates of the Si-Core layer 110 crystalline material, where the conduction band (CB) minimum of the Si-Core layer 110 material is located (see FIG. 2C). Both conditions are met when the stand-off field electric field, coupled through the metal contact layers 140 and 150 of the QPEC 100 Si-Core layer 110 material, is aligned along the QPEC Si-Core layer 110 material X-axis and having the potential energy sufficient to increase the potential energy of the excited electrons to reach the impact ionization threshold of $E_I>2.24$ eV per excited electron. In effect, electrons excited by the avalanche ionization process of the QPEC 100 integrate potential energy from the stand-off field electric field, coupled through the metal contact layers 140 and 150 of the QPEC 100, while being transported by the field along the X-axis of the Si-Core layer 110 crystalline material to reach the impact ionization threshold and while simultaneously their momentum is being aligned in the direction where the excited electrons would relax, i.e., the selected direction of the coupled the stand-off field electric field.

QPEC 100 Quantum Ionization Effect—the foregoing description discloses the details of the photonic and stand-off electric fields induced avalanche ionization process of the QPEC 100. Unlike an impact ionization process induced only by a photonic field excitation of FIG. 2B or that induced by an electric field excitation only, in the photonic/electric fields induced avalanche ionization process of the QPEC 100, the excitation occurs in quanta of $E_g$. The net effect of the QPEC 100 avalanche ionization process is that the maximum direct bandgap energy $E_{max}$ of the Si-Core layer 110 is quantized by the coupled stand-off electric field into quanta that equals the minimum indirect bandgap energy $E_g$. As described earlier, in the QPEC 100 avalanche ionization process, excited free electrons (and holes) gain (and integrate) potential energy and momentum while being transported by the coupled electric field. When the integrated potential energy of the excited electron reaches $2E_g$, the electron undergoes a quantum energy transfer process in which it emits a photon of potential energy $E_g$, its excess energy above the CB minimum energy. The photon is absorbed by a lattice bound electron of an adjacent un-excited Si atom causing that electron to be excited across the minimum indirect bandgap energy $E_g$, hence the excited electron multiplication effect of the avalanche process. In that process, both of the excited electrons gain momentum, the newly excited electron gains momentum to cross the indirect bandgap and reach the CB minimum and the relaxed electron gains momentum in the direction of the coupled stand-off field to resume its transport across coupled field and resets the process of integrating potential energy from the coupled stand-off field. The process is repeated when the integrated potential energy of (both) excited electrons reaches $2E_g$. As this quantized relaxation, excitation (multiplication) and transport process continue, fewer adjacent un-excited atoms become available in the vicinity of the electrons transported by the coupled stand-off field and approaching the high potential side of the coupled field. As a result, the potential energy integration effect exhibited by the excited electrons continues beyond $2E_g$ to reach $3E_g$ towards the Si VB maximum energy point where the excited electron stops gaining momentum and settles at the Γ point where k=0 and its potential energy gain becomes restricted by the Si energy band structure. This process, in effect, tightly packs the excited electrons within the region of Si atoms adjacent to the high potential side of the coupled electric field where the excited electrons, thus the negative Si ions, are settled at the Si CB maximum energy point, the top of the direct Si energy bandgap and the resultant holes, thus the positive Si ions, tightly packed within the region of Si atoms adjacent to the low potential side of the coupled electric field.

The holes generated by the described quantized relaxation process are generated at the Si VB maximum energy at the Γ point where k=0 since when the excited electron integrated potential energy is reset when it reaches $2E_g$, the electron's integrated potential energy and momentum is partitioned equally between the process' two excited electrons, settling at the CB minimum at X symmetry point, thus creating a hole at the ground state of the Si VB maximum at the Γ point where k=0. In effect, therefore, the described Quantum Ionization Effect of the QPEC 100 amplifies the photonic/electric fields induced avalanche ionization process while integrating the resultant electrons and holes across the Si maximum energy bandgap, in the k-space energy band structure, and physically across the opposing sides of the coupled electric field. This is a unique process dominated by electron/lattice quantized energy interaction (or scattering) which suppresses the electron/phonon interaction (or scattering) that tends to cause scattering electron energy transfer inefficiencies.

As the electrons and holes excited by the avalanche ionization process gain potential energy from the coupled field, they are also transported to their respective side of the coupled field, i.e., electrons are transported toward the contact layer 130 and holes are transported toward the common contact layer 140. As the avalanche ionization process continues, the Si-Core layer 110 is partitioned into three regions; namely, a region of negative ions near the contact layer 130 and a region of positive ions near the common contact layer 140 separated by a region of unionized Si-Core layer 110 atoms. As the avalanche ionization process continues, the unionized region of the Si-Core layer 110 forms a Si-Core layer 110 capacitance 115 that separates the ionized Si-Core layer 110 regions. The formed dipolar polarization field of the formed Si-Core layer 110 separation capacitance is electrically aligned with the coupled stand-off field and acts to strengthen the ions separation action of the coupled stand-off field. As the avalanche ionization process continues, the width of the formed Si-Core layer 110 ions separation region systematically decreases as the widths of the opposing negative and positive ions regions systematically increase. As a result, the formed Si-Core layer 110 capacitance 115 increases systematically with the progression of the avalanche ionization process.

Figure 3:
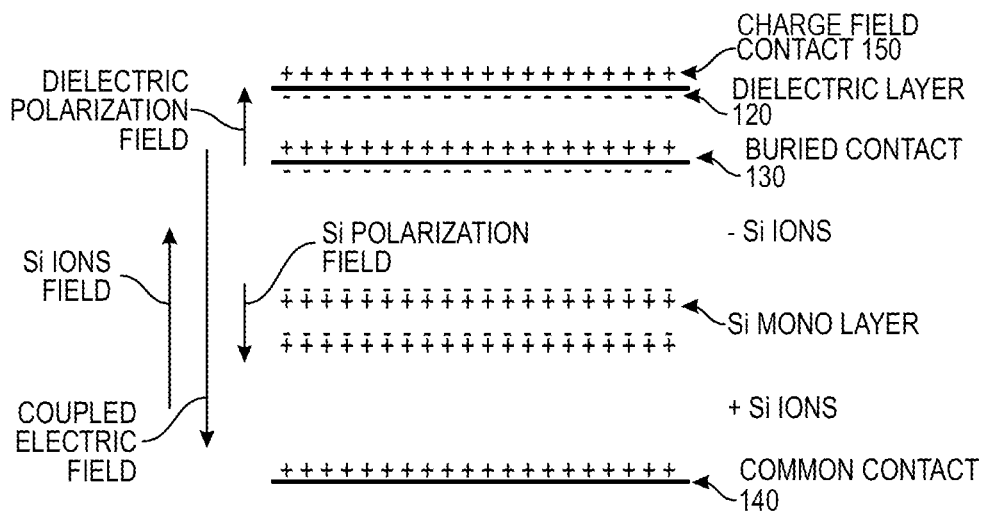
FIG. 3 illustrates the 4-Fields balance of the QPEC according to embodiments of this invention.

4-Fields Balance—during the avalanche ionization progression, four electric fields (4-Fields) are electrically in balance: in one direction the coupled electric field is electrically aligned, thus additive, with the dipolar polarization field of the Si-Core layer 110 capacitance 115, and in the opposite direction, the Si-Core layer 110 ions field is electrically aligned, thus additive, with the dipolar polarization field of the dielectric layer 120. FIG. 3 illustrates the 4-Field balance of the QPEC 100. When the avalanche ionization process drives the QPEC 100 to the fully charged state, the electrical balance of these 4-Fields makes the energy stored in the Si-Core layer 110 capacitance separation 115 equal to the energy stored in the dielectric layer 120 capacitance and since the Si-Core layer 110 separation capacitance 115 and the dielectric layer 120 capacitance are aligned in parallel, the energies stored in the Si-Core layer 110 and the dielectric layer 120 are additive.

Inversion State—with the described 4-Fields balance of the QPEC 100, the Si-Core layer 110 separation capacitance 115 dipolar polarization field reinforces the Si-Core layer 110 ions separation action of the coupled stand-off electric field, internally from the center of the Si-Core layer 110. The Si-Core layer 110 separation capacitance 115 dipolar polarization field becomes stronger as the Si-Core layer 110 separation 115 width is decreased by the avalanche ionization and ions separation action of the coupled stand-off electric field. When the coupled stand-off field is made stronger, at higher potential coupled between the QPEC 100 contact layers 140 and 150, its avalanche ionization and separation action increases and as a consequence the Si-Core layer 110 separation 115 width decreases and its dipolar polarization field strength increases, further reinforcing the Si-Core layer 110 ions separation action of the coupled stand-off field. Reciprocally the coupled stand-off electric field, being opposed to the Si-Core layer 110 ions field, screens the Si-Core layer 110 ions potential separation as the Si-Core layer 110 separation 115 width decreases. An action that allows the Si-Core layer 110 ions separation 115 width to be reduced to the order of few Si atoms, i.e., few hundred picometers, width without reaching breakdown condition due to the Si-Core layer 110 ions potential separation. With the Si-Core layer 110 ions potential separation screening action of the coupled stand-off field, the limit of the stand-off field potential increase is set forth by the dielectric layer 120 capacitance responsible for transposing the electric field coupled through the QPEC 100 contact layers 140 and 150 to the Si-Core layer 110 interface. That limit is determined by the breakdown potential of the dielectric layer 120.

Figure 4:
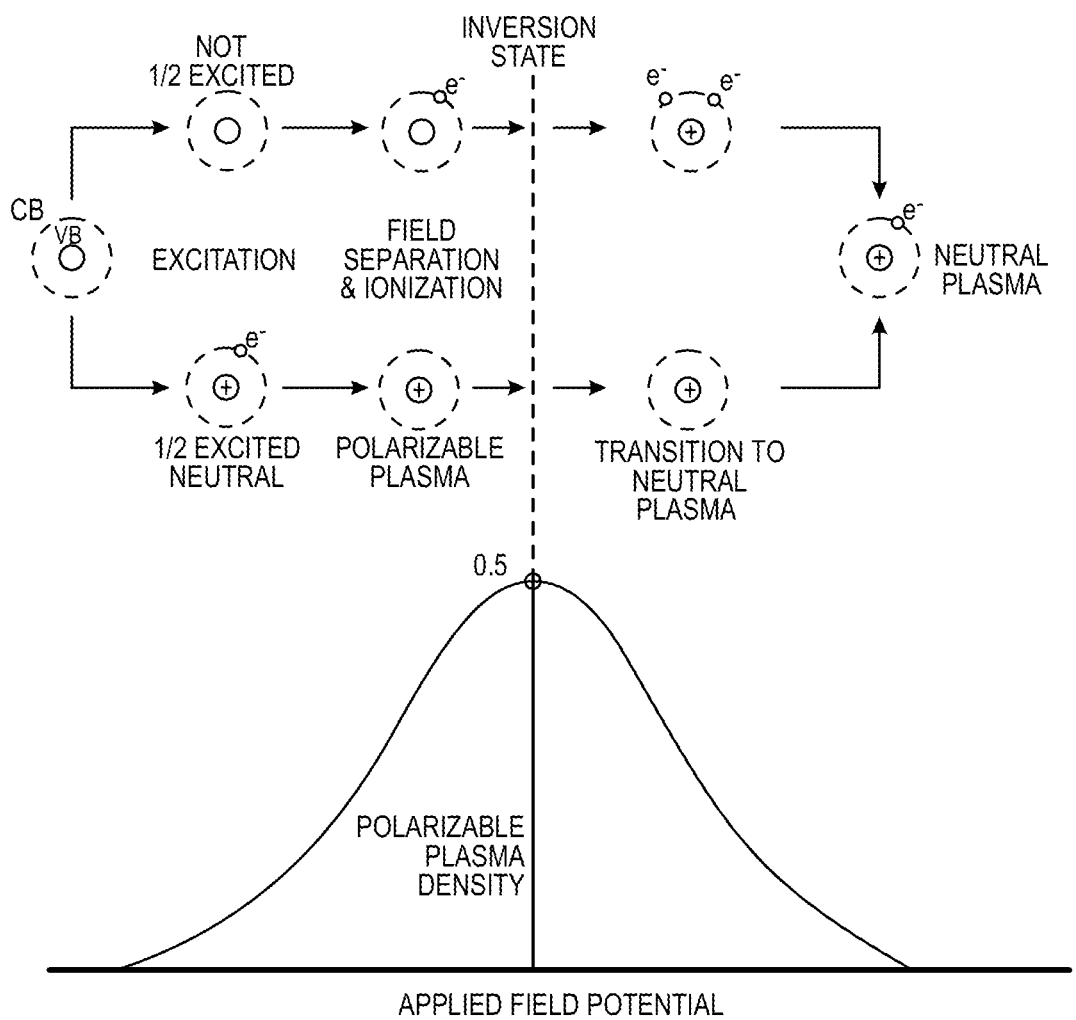
FIG. 4 illustrates the various stages leading to the QPEC reaching the inversion state.

When the dielectric layer 120 design parameters, i.e., dielectric constant and thickness, are selected to enable the coupled stand-off field induced avalanche ionization and separation to excite nearly half of the Si-Core layer 110 atoms and separate the formed ions to their respective sides, the achieved Si-Core layer 110 ion density approaches the Si-Core layer 110 material atomic density, i.e., ~$5 \times 10^{22}$ ions per cm$^3$. This state is herein referred to as the "inversion state" and it defines the fully charged state of the QPEC 100. FIG. 4 illustrates the various stages leading to the QPEC 100 reaching the inversion state. As illustrated in FIG. 4, when the Si-Core layer 110 atoms are excited by the combined action of the coupled photo and electric fields, the Si-Core layer 110 atoms are first ionized, then the resultant excited electrons are transported by the coupled electric field to the high potential side of the coupled field leaving behind the unexcited Si-Core layer 110 atoms accumulated at the low potential side of the coupled field. As this process of Si-Core layer 110 atoms excitation and separation continues, the excited electrons are separated from their excited atoms leaving behind a positive ion atom at the low potential side of the coupled field and the separated excited free electrons become predominantly located within the CB of the unexcited Si-Core layer 110 atoms, thus creating negative ions atoms at the high potential side of the coupled field. As illustrated in FIG. 4, the process leads to the formation of negative and positive Si ions plasma polarized to the opposing sides of the coupled field. The formed polarized Si ions plasma density systematically increases as this process continues until nearly one half of the Si-Core layer 110 atoms are excited at which point the Si ions are separated by a monolayer layer of unexcited Si atoms separating the polarized Si ions plasma sides. At this stage the Si ions plasma density reaches its maximum value. As illustrated in FIG. 4, it's postulated that when the Si-Core layer 110 ionization continues further to tip the polarized Si ions plasma balance achieved at the inversion state, systematically less unexcited Si atoms are available to form negative Si ions and at that stage the formed Si plasma is gradually transferred into un-polarizable neutral plasma. Since continuing the photo and electric fields ionization action beyond the inversion state transitions the formed Si ions to un-polarizable neutral plasma, the maximum polarizable Si ions plasma density occurs when the inversion state is reached. Therefore, the QPEC 100 is fully charged when the inversion state is reached.

Figure 5A:
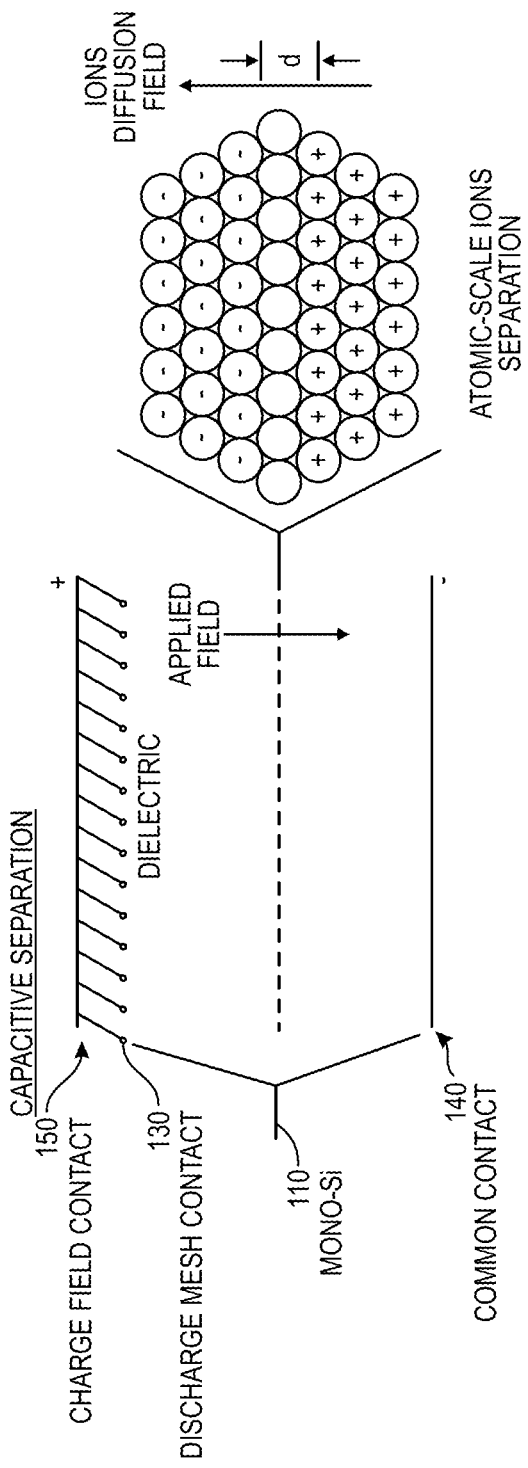
FIG. 5A illustrates the QPEC avalanche ionization process effect in creating the monolayer Si-Core separation of few Si atoms in width.

Monolayer Si-Core Layer 110 Separation—when the inversion state is reached, the described ions separation action of the QPEC 100 avalanche ionization process ionizes the Si-Core layer 110 and transports (polarize) the Si ions towards their respective sides of the coupled electric field leaving a monolayer of un-excited and un-ionized atoms closely packed at the center of the Si-Core layer 110 separating the opposing Si ions accumulated at the opposing sides of the coupled electric field. FIG. 5A illustrates the QPEC 100 avalanche ionization process effect in creating the monolayer Si-Core layer 110 separation of a few Si atoms in width. As explained, the 4-Field balance effect causes screening of the Si ions chemical potential, i.e., the potential separation across the Si-Core layer 110 material maximum direct bandgap energy $E_{max}$=3.4 eV. As a result of the Si ions chemical potential screening, the monolayer Si-Core layer 110 separation can reach a few Si atoms in width. Given the Si covalent diameter of 220 pm, the closely packed monolayer Si-Core layer 110 of 2, 3, 4 Si atoms width creates approximately 380 pm, 572 pm, and 760 pm of Si ion separation, respectively. These width values of the monolayer Si-Core layer 110 separation and the fact that formed Si-Core layer 110 capacitance value increases with the increase of the coupled stand-off field potential make the formed Si-Core layer 110 separation capacitance a "Super Capacitance".

Figure 5B:
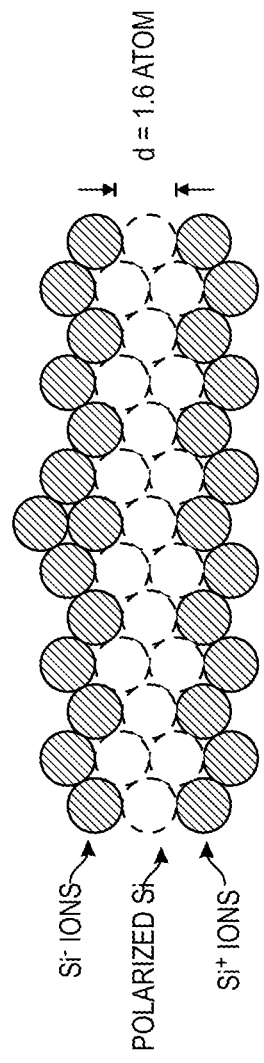
FIG. 5B illustrates a formed ionized Si lattice divided into three regions, according to an embodiment of the invention.

Again with reference to FIG. 5A, with seed photo-excitation, the applied field potential 1) excites the mono-Si atoms by impact excitation; 2) relaxes the excited charge carriers of the mono-Si atoms to the edges of the Si band-gap energy, and in process; 3) converts the excited charge carriers energy in excess of the Si band-gap energy into additional carriers (avalanche magnification effect); then 4) transports, the Si ions toward the opposing sides of the mono-Si. Also, as explained, this excitation/ionization/polarization process continues until it "self-quenches" when the diffusion field of the field—separated Si ions are in opposing balance with the applied field, a condition that defines the "fully charged" state of the formed Si capacitance. The energy stored within the formed Si capacitance depends on the magnitude of the applied field potential, or density, the higher the applied field potential, the higher the Si ionic concentration within the formed Si capacitance. This is because the increased applied field potential contributes to increasing the ionic density (or number of generated Si ions), a property not shared by dielectric or electrolytic capacitance. The ions separation effect by the applied field potential systematically separates the opposing charge ions to correspondingly opposing sides of the mono-Si. (See FIG. 5A). As a result, the formed ionized Si lattice is divided into three regions: 1) positive ions region at the side of the opposing field polarity; 2) negative ions region at the side of the opposing field polarity; and 3) a neutral atoms region in the middle between the separated ions region. The neutral atoms region constitutes the formed Si capacitance as it acts as an "atomic a layer dielectric" (See FIG. 5B).

Dielectric Layer 120 Parameters—Table-1 outlines the salient parameters of several candidate materials for the dielectric layer 120 design parameters.

TABLE-1

| Properties | Dielectric Layer Material | | |
|---|---|---|---|
| | Silicon Oxide $SiO_2$ | Silicon Nitride $Si_3N_4$ | Gallium Nitride GaN |
| Dielectric Constant $\varepsilon$ | 3.9 | 7.5 | 9 |
| Bandgap (eV) | 9 | 5 | 3.4 |
| Breakdown Voltage (V/nm) | 2.7 | 25 | Higher |
| Thickness at 100 V d (nm) | 37 | 4 | Higher |
| Capacitance Factor ($\varepsilon$/d) | $0.1 \times 10^9$ | $1.875 \times 10^9$ | Higher |

The relevance of the energy bandgap parameter for the dielectric layer 120 is that it should be larger than the energy indirect bandgap of the Si-Core layer 110 $E_g$=1.12 eV. The reason for that design constraint is that the dielectric layer 120 should not absorb and get ionized by the photoexcitation light generated by LEDs 160 used to photo ionize the Si-Core layer 110. The relevance of the breakdown potential parameter of the dielectric layer 120 is that it sets forth the applied field potential limit at the selected thickness for the dielectric layer 120, thus defining the upper limit of the stand-off field potential and its Si-Core layer 110 ionization and ions separation capabilities. For example, for a selected thickness of the dielectric layer 120, selecting silicon nitride ($Si_3N_4$) enables the stand-off potential to reach 10 times the value of silicon oxide ($SiO_2$) before breakdown condition occurs. Another important factor to consider in selecting the dielectric layer 120 material minimum thickness besides the breakdown potential is material leakage at the target applied field potential. The leakage factor depends on the crystalline properties of the selected dielectric material. As such, using monocrystalline dielectric material becomes more critical as the dielectric material thickness is reduced to increase its capacitance. The capacitance factor (dielectric constant/ thickness) is the culmination of the dielectric layer 120 design parameters discussed in that it is a single parameter that can maximized while accommodating the target applied filed potential with reaching breakdown condition. Given Si-Core layer 110 properties, and the dielectric layer 120 parameters of several candidate materials, the QPEC 100 design tradeoff examples discussed below assume the use of $Si_3N_4$ material for the dielectric layer 120 since it satisfies that design selection criteria outlined above with ample margin.

Figure 6A:
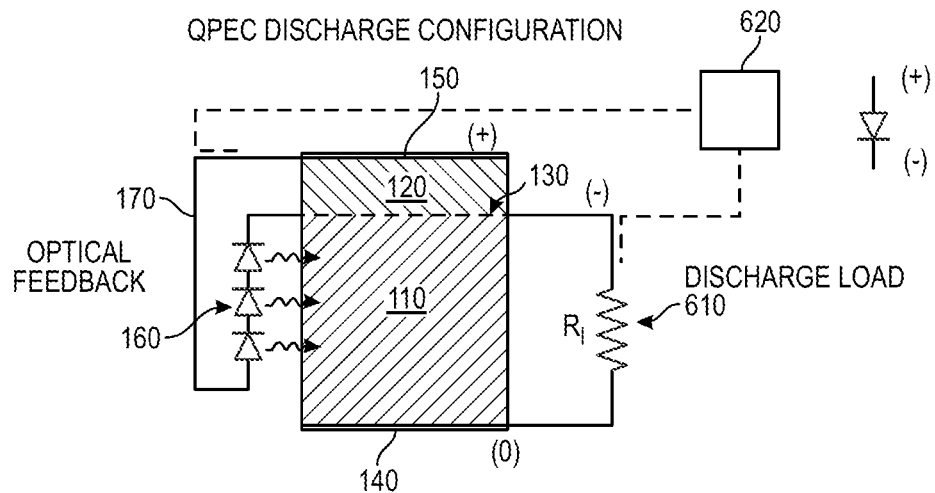
FIG. 6A illustrates the QPEC discharge configuration according to one embodiment of this invention.

QPEC 100 Charge and Discharge Methods—FIG. 6A illustrates one embodiment of the QPEC 100 discharge configuration. In this QPEC 100 discharge configuration, a discharge load $R_l$ 510 is connected between the common contact layer 140 and the contact layer 130 to extract (or discharge) the electrons stored in the Si-Core layer 110. Simultaneously the photo ionization LEDs 160 are connected between the common contact layer 140 and the field contact layer 140 to discharge the energy stored in dielectric layer 120 and convert that energy into photoexcitation of the Si-Core layer 110. A discharge control circuit 520 that senses the discharge current flow from the contact layer 130 to the load $R_l$ 510 and the current flow from the contact layer 130 to the photoexcitation LEDs 160 regulates these two discharge current components to maintain energy balance between the Si-Core layer 110 and the dielectric layer 120. As electrons are discharged (or extracted) from the Si-Core layer 110 by the discharge (operational) load, or resistance, $R_l$ 510, the excess stand-off electric field transposed by the dielectric layer 120 above the described 4-Fields balance point is used to optically pump (or inject) more electrons into the Si-Core layer 110. The excited electrons optically pumped into the Si-Core layer 110 go through the quantum avalanche ionization process explained earlier to generate additional excited electrons to maintain the 4-Fields balance during the discharge process. The discharge current components allocated to the operational load $R_l$ 510 and to the photoexcitation LEDs 160 (optical pumping discharge feedback) are selected (controlled by the discharge circuit) such that the 4-Fields balance and its associated stored energy balance are maintained as electrons are being extracted by the operational load $R_l$ 510 from the Si-Core layer 110 through the discharge contact layer 130.

Figure 6B:
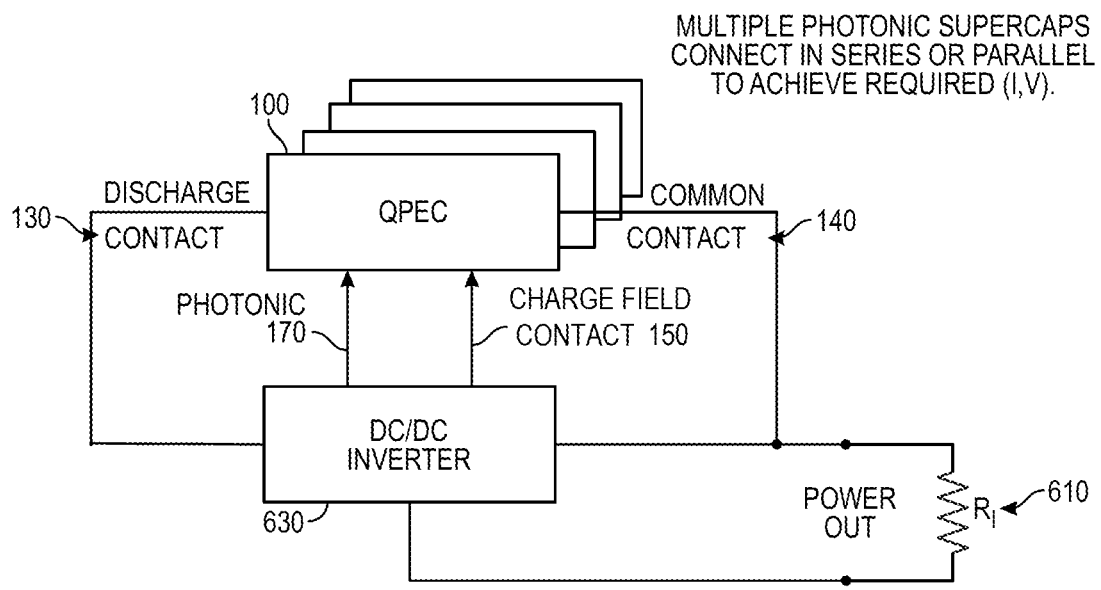
FIG. 6B illustrates the QPEC discharge configuration according to another embodiment of this invention.

FIG. 6B illustrates another embodiment of the QPEC 100 discharge configuration. In this discharge configuration, the QPEC 100 has three contacts, namely, the contact layer 130, the common contact layer 140 and the field contact layer 150. These contact layers are connected to an inverter 530 that regulates the discharge current from the contact layer 130 and the field contact layer 150, then inverts and combines the two extraction potentials into the extraction potential required by the operational load $R_l$ 510. As in the prior discharge configuration embodiment, the inverter 530 of the QPEC discharge configuration illustrated in FIG. 6B regulates the current drawn from the Si-Core layer 110 through the contact layer 130 and the current coupled into the field contact layer 150 to discharge the dielectric layer 120 such that the values of these two discharge current components maintains the energy balance between the Si-Core layer 110 and the dielectric layer 120.

Again with reference to FIG. 6B, the charged dielectric capacitance sustains the electric field, thus the charge separation of the Si-Core layer 110 of the QPEC 100 after the self-quenching charge threshold is reached. When charge carriers are extracted through the contact layer 130, both capacitances (mono-Si and dielectric) are discharged.

With respect to regulating the QPEC 100 discharge, during discharge, a feedback charge loop is turned on. The photo ionizer is energized or turned on by feedback. Only the desired portion of energy is out put to the load while the rest of the extracted energy is fed back to recharge the mono-Si and dielectric capacitance. Discharge operates at the maximum energy output point for achieving the highest extraction efficiency, with excess energy beyond what is demanded by the load fed back to recharge the capacitances. Connecting multiple photonic QPECs in series allows for reaching an ionization electric field level that can make the feedback regulator more efficient. The DC/DC inverter 530 controls photonic QPEC 100 charge and discharge processes. In the charge cycle, it divides the charge power to photo and field ionizers. In the discharge cycle, it regulates energy discharge rate and discharges at a required load rate.

Figure 6C:
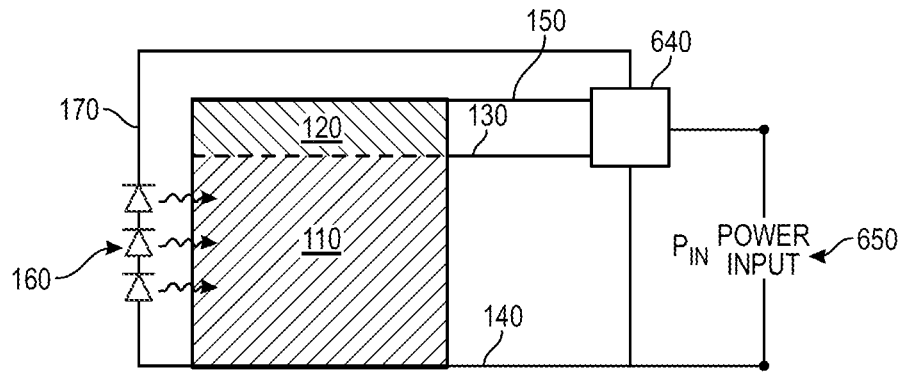
FIG. 6C illustrates an embodiment of the QPEC 100 charge configuration.

FIG. 6C illustrates an embodiment of the QPEC 100 charge configuration. In this QPEC 100 charge configuration, a charge power input Pin 550 is connected to a charge circuit (charger) 540 having four charge outputs provided to the QPEC 100 common contact layer 140, contact layer 130, field contact layer 150, photo ionizer LEDs 160, and contact layer 170. In the initial stage of the charge process the target field potential generated by the charger 540 is connected to the field contact layer 150 and simultaneously to the photo ionizer LEDs 160 contact layer 170. To kick-start the coupled field transposition by the dielectric layer 120, a negative potential in the range of the Si-Core layer 110 chemical potential (~3.4 V) is connected to the QPEC 100 contact layer 130. Supplying a charge potential through the contact layer 130 together with the field potential supplied through the field contact layer 150 expedites the dipolar polarization of the dielectric layer 120. As the dielectric layer 120 becomes systematically more polarized during the initial stage of the charge process, the electric field coupled through the field contact layer 150 is transposed to the interface between the dielectric layer 120 and the Si-Core layer 110 to initiate the Si-Core layer 110 ionization process by the coupled field. The initial charge stage lasts until the dielectric layer 120 is sufficiently polarized to initiate the Si-Core layer 110 ionization process by the transposed coupled field. The indication of reaching the end of the initial charge stage is an increased current draw through the field contact layer 150 that substantiates the energy transferred from the coupled field to ionize the SI-Core layer 110. When the initial charge stage is reached, the potential supply to the contact layer 130 is disconnected as the ionized Si-Core layer 110 negative ions accumulate near the dielectric layer interface 120 and their potential extends the dielectric layer 120 dipolar polarization further. As the combined ionization effects of the coupled light from the LEDs 160 and the coupled and transposed electric field systematically makes the Si-Core layer 110 reaches the inversion state, the QPEC 100 reaches fully charged state.

Figure 6D:
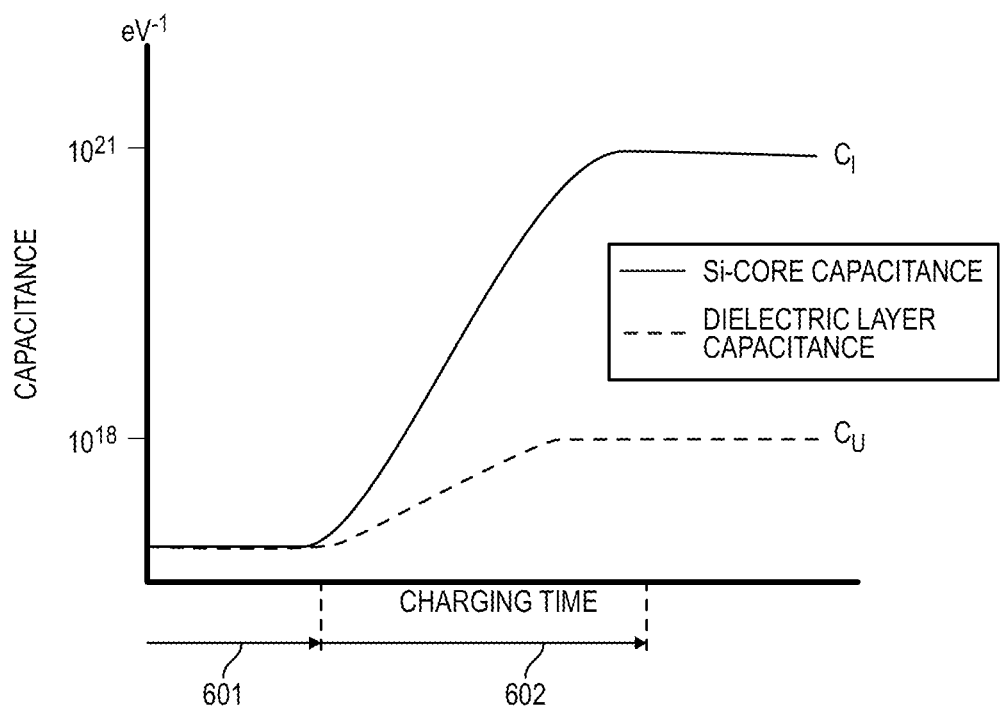
FIG. 6D illustrates the typical charge timeline of the QPEC 100.

FIG. 6D illustrates the typical charge timeline of the QPEC 100. When the QPEC 100 reaches the fully charged state (inversion state), the charges storage capacitance of the Si-Core layer 110 is orders of magnitude higher than the charges storage capacitance of the dielectric layer 120. However, the potential of the charges stored in dielectric layer 120 is much higher than the potential of the charges stored in the Si-Core layer 110. The opposing difference in the magnitude of the stored charges and their potential in the Si-Core layer 110 and the dielectric layer 120 accounts for the energy stored in these two layers of QPEC 100 being equal.

As illustrated in FIG. 6D, during a first charging period 601, two dielectric layers are charged by outer contacts as a single capacitor with a composite dielectric constant. During the second charging period 602 following the first charging period 601, the Si-Core layer 110 dielectric is photo ionized, then further ionized by the two outer contacts field. The ionized SI-Core layer 110 charges form a split, ionic capacitor, making the two dielectrics separate into two separate capacitors sharing the negative Si-Core layer 110 ions. The ionized Si-Core layer 110 forms an ionic, super capacitance that is orders of magnitude larger than the upper dielectric capacitance.

Figure 7:
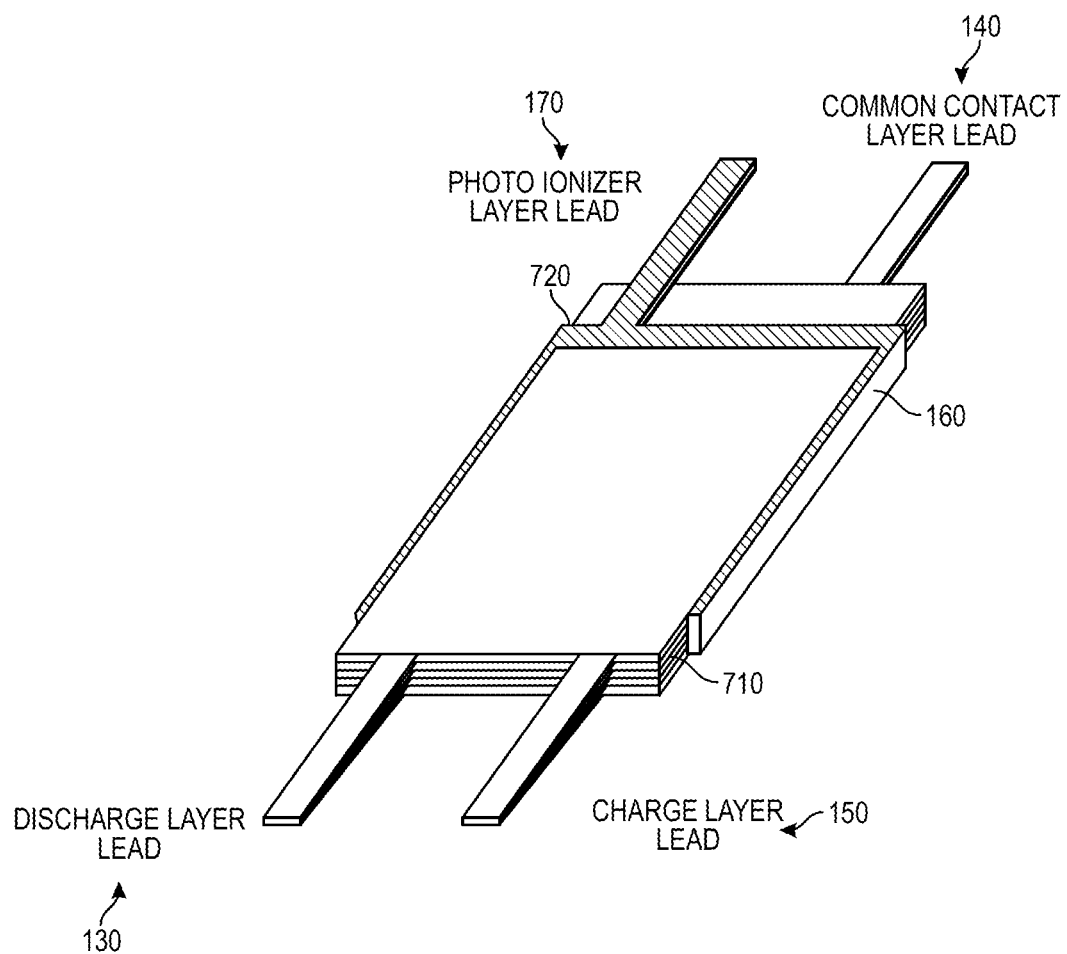
FIG. 7 illustrates the packaging configuration of the QPEC of this invention.

QPEC 100 Packaging Methods—FIG. 7 illustrates the packaging configuration of the QPEC 100. Typically, the QPEC 100 can be manufactured into standard semiconductors wafer sizes, for example, 10 cm, 15 cm, 20 cm, 25 cm or 30 cm in diameter. The manufactured QPEC 100 wafers are then diced into cell sections having the dimensions of the QPEC package (or module). The thickness of the diced section is informed by the thickness of the Si-Core layer 110, for example, in the range of ~200 to 300 microns. The diced QPEC sections are then stacked with the adjacent cell's surfaces and eutectic bonded together while allowing a contact metal to extend beyond the diced QPEC 100 cell section dimensions. The extended metal contacts of the stacked and bonded QPEC 100 cell sections are connected to create the four contact leads of the QPEC module illustrated in FIG. 6, i.e., the contact layer 130 lead, the common contact layer 140 lead, the field contact layer 150 lead and the LEDs 160 contact 170 lead. The isometric illustration of FIG. 6 shows the multiple QPEC 100 cell sections stack 610 and the LEDs 160 optically coupled to the edge of the QPEC 100 cell sections stack 610. With QPEC 100 packaging configuration the photoexcitation LEDs are assembled separately on a flex substrate 620 which is first bonded onto one surface of the QPEC 100 cell sections stack 610 then optically bonded to edge of the QPEC 100 cell sections stack 610. The total thickness of the QPEC 100 module 600 depends on the number of QPEC 100 stacked sections comprising the module and typically depends on the target application. For example, for wearable and mobile electronics applications where both weight and volumetric displacement are paramount, a 1 mm or 2 mm thick QPEC module 600 can be packaged using stacks of 5 to 10 QPEC 100 200-microns thick sections. Based on the QPEC 100 design example discussed below, the energy density metric of a 200-microns thick QPEC 100 is in the range 146 mW·Hr·cm$^{-2}$ of its surface area. Based on this energy density metric a 1 mm thick QPEC module 600 comprising a stack of five 200-microns thick QPEC 100 sections and having 10 cm$^2$ of surface area supplies approximately 7.3 W·Hr of energy, which is a substantially notable improvement over commonly used batteries and which will enable energy supply for phones and laptop PCs for extended time periods but most importantly enable wearable electronics that have extensive processing capabilities, yet light in weight and small in volume.

QPEC 100 Design Methods—The most salient design aspect of the QPEC 100 is the equality of the energy stored in the Si-Core layer 110 and the dielectric layer 120 capacitances. Using this stored energy equality property plus the inversion state property of the QPEC 100 avalanche process of exciting nearly half of the Si-Core layer 110 atoms when the inversion (fully charged) state is reached, the energy storage capacitance of the Si-Core layer 110, designated as $C_I$, is determined. Then the Si-Core layer 110 and the dielectric layer 120 stored energy equality property is used to determine the thickness of the dielectric layer 120, designated as $d_u$ and coupled electric field potential, designated V. Using the determined coupled electric field potential V, the chemical potential of the Si ions stored in Si-Core layer 110, designated v, and the ratio of dielectric layer 120 dielectric constant to the Si-Core layer 110 dielectric constant, designated as $(\alpha_u/\alpha_I)$, the ratio of the dielectric layer 120 thickness to the Si-Core ions separation 115 width, designated as $(d_u/d_I)$, is determined. With these design parameters of the QPEC 100 being determined, the combined energy stored in the Si-Core layer 110 and the dielectric layer 120 determines the total energy stored in the QPEC 100.

Using the disclosed QPEC 100 design method, the Si-Core layer 110 ions separation 115 width di, versus the coupled electric field potential V for a range of the dielectric layer 120 thickness $d_u$ is tabulated in Table-2.

TABLE-2

| V | $C_u/C_I$ | $d_u$ = 20 nm | $d_u$ = 30 nm | $d_u$ = 40 nm | $d_u$ = 50 nm |
|---|---|---|---|---|---|
| 25 v | 69.77 | 455 pm | 682 pm | 909 pm | 1.14 pm |
| 27.6 v | 83.13 | 381 pm | 572 pm | 763 pm | 954 pm |
| 30 v | 96.50 | 329 pm | 493 pm | 657 pm | 822 pm |
| 34.6 v | 124.91 | 254 pm | 381 pm | 508 pm | 635 pm |
| 35 v | 127.56 | 249 pm | 378 pm | 498 pm | 623 pm |
| 37.4 v | 144. | 220 pm | 330 pm | 441 pm | 551 pm |
| 40 v | 162.94 | | 292 pm | 390 pm | 487 pm |
| 40.5 v | 166.71 | | 286 pm | 381 pm | 476 pm |
| 45 v | 202.64 | | 235 pm | 313 pm | 391 pm |
| 45.6 v | 207.7 | | 229 pm | 305 pm | 381 pm |
| 46.6 v | 216.26 | | 220 pm | 293 pm | 367 pm |

TABLE-2-continued

| | | $d_l$ | | | |
|---|---|---|---|---|---|
| V | $C_u/C_l$ | $d_u$ = 20 nm | $d_u$ = 30 nm | $d_u$ = 40 nm | $d_u$ = 50 nm |
| 50 v | 246.67 | | | 257 pm | 321 pm |
| 54.3 v | 288.0 | | | 220 pm | 275 pm |
| 55 v | 295.03 | | | | 269 pm |
| 60 v | 347.71 | | | | 228 pm |
| 61.1 v | 359.88 | | | | 220 pm |

In this QPEC 100 design example the Si-Core layer 110 thickness is selected at 200 micron and silicon nitride ($Si_3N_4$) material is selected for the dielectric layer 120. With these selected design parameters, the dielectric constant of the dielectric layer 120 $\alpha_u$=7.5, and the dielectric constant of the Si-Core layer 110 material $\alpha_l$=3.9, and their ratio ($\alpha_u/\alpha_l$)=1.9. The dielectric layer 120 material should be selected to enable the highest possible value of the dielectric constants' ratio ($\alpha_u/\alpha_l$). With these selections of the QPEC design parameters, as illustrated in Table-2, for the coupled electric field potential V ranging from 25 v to 70 v, the Si-Core layer 110 separation 115 width di is from one to five Si atoms when the dielectric layer 120 thickness $d_u$ is selected in the range from 20 nm to 50 nm.

Within the range of the QPEC 100 design parameters, the energy stored in the dielectric layer 120, which also equals the energy stored in the Si-Core layer 110, is presented in Table-3 when the Si-Core layer 110 thickness is 200-microns, the Si-Core layer 110 ions separation 115 width di is two Si atoms, i.e., $d_l$=381 nm and the dielectric layer 120 thickness $d_u$ ranges from 20 nm to 50 nm.

TABLE-3

| | | $C_u$ ($10^{18}$ $e^-$ $v^{-1}$ $cm^{-2}$) | | | |
|---|---|---|---|---|---|
| V | $C_u/C_l$ | $d_u$ = 20 nm | $d_u$ = 30 nm | $d_u$ = 40 nm | $d_u$ = 50 nm |
| 27.6 v | 83.13 | 3.538 | | | |
| 34.6 v | 124.91 | | 2.357 | | |
| 40.5 v | 162.94 | | | 1.743 | |
| 45.6 v | 166.71 | | | | 1.1418 |

$D_l$ = 381 nm, 2-atom monolayer
$C_u$ = 0.294 × $10^{21}$ $e^-$ $v^{-1}$ $cm^{-2}$
$Si_3N_4$ Dielectric Layer
$E_u$ = $E_l$ = 73.19 mW Hr $cm^{-2}$
Total Energy = $E_u$ = $E_l$ = 146.38 mW Hr $cm^{-2}$ As illustrated in Table-3, the energy stored in the dielectric layer 120 is in the range of 73.19 mW·Hr·$cm^{-2}$ of surface area of the QPEC. With the energy equality property of the QPEC 100, the design example presented in Table-3 indicates that with the selected QPEC 100 design parameters, the QPEC 100 stored energy is in the range 146 mW·Hr·$cm^{-2}$ of surface area of the QPEC. Extrapolating the stored energy per square centimeter of surface area of the QPEC 100 while taking into account the selected Si-Core layer 110 thickness of 200 microns, based on this design example, the QPEC 100 volumetric density is 7.3 KWHr/L. In taking into account the density of Si-Core layer 110 material of 2.238 g/$cm^{-2}$, based on this design example, the QPEC 100 gravimetric density is 3.136 KWHr/Kg. Given that the most popular energy cell, namely Li-Ion, volumetric energy density ranges from 0.25 to 0.7 KWHr/L, the QPEC 100 volumetric energy density outperforms Li-Ion cells by a factor ranging from 10× to 29×. Given that gravimetric density energy density of Li-Ion cells ranges from 0.1 to 0.265 KWHr/Kg, based on this design example, the QPEC 100 gravimetric energy density outperforms Li-Ion cells by a factor ranging from 12× to 31×.

Figure 8:
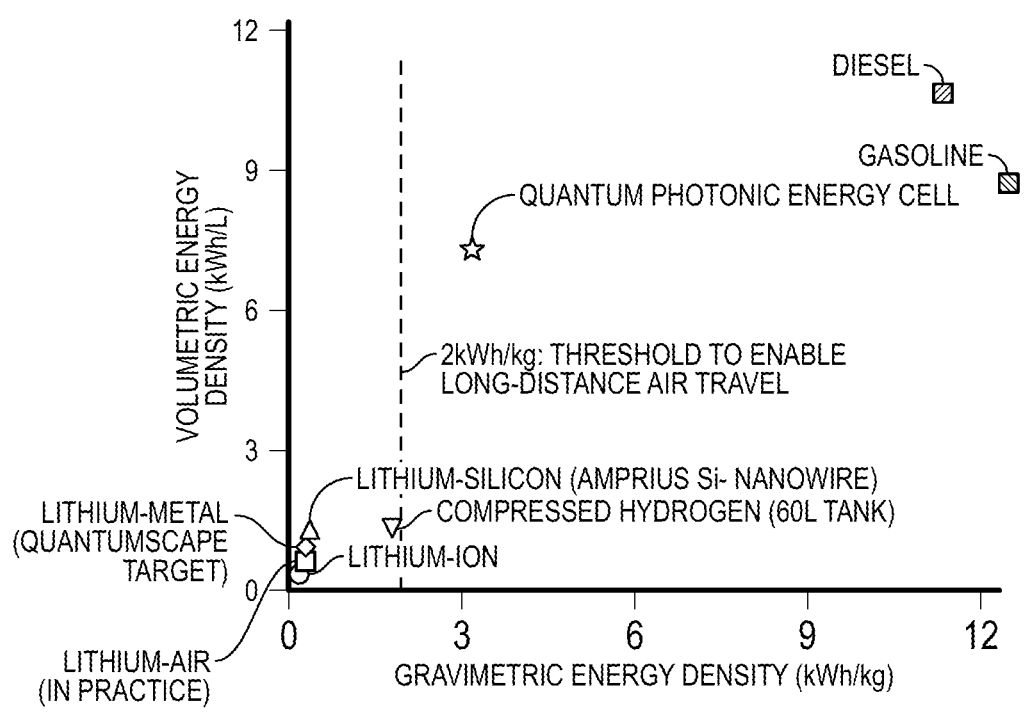
FIG. 8 presents a comparison of the QPEC volumetric and gravimetric energy densities with that of the most popular batteries currently available and predicted to be available in the future.

Energy density comparison—with the presented QPEC 100 stored energy of the foregoing design example, FIG. 8 presents a comparison of the QPEC volumetric and gravimetric energy densities with that of the most popular batteries currently available and predicted to be available in the future. As can be seen from FIG. 8, the QPEC energy density is multiple times higher than the energy density of popular batteries, thus effectively closing the energy density gap between popular batteries and fossil fuel and enabling a more effective electric energy storage for a wide range of applications including some applications that are highly dependent on fossil fuel energy density, such as aircrafts. As illustrated in FIG. 8, the QPEC 100 gravimetric energy density of 3.136 KWHr/Kg exceeds the threshold of 2 KWHr/Kg to enable long-distance air travel, thus the QPEC 100 is a viable energy storage cell to enable electrical aircrafts and electrical long-distance air travel.

Those skilled in the art will readily appreciate that various modifications and changes can be applied to the embodiments of the invention without departing from its scope defined in and by the appended claims. It should be appreciated that the foregoing examples of the invention are illustrative only, and that the invention can be embodied in other specific forms without departing from the spirit or essential characteristics thereof. The disclosed embodiments, therefore, should not be considered restrictive in any sense. The scope of the invention is indicated by the appended claims, rather than the preceding description, and all variations which fall within the meaning and range of equivalents thereof are intended to be embraced therein.

What is claimed:
1. An energy storage cell, comprising:
   a common contact layer (140);
   a core layer of silicon (110) adjacent the common contact layer and having a dielectric constant and a band-gap energy;
   a dielectric layer (120) adjacent the core layer, comprising a material having a dielectric constant greater than the dielectric constant of the core layer, and having a band-gap energy higher than the band-gap energy of the core layer;
   a discharge contact layer (130) interposed between the core layer and the dielectric layer to extract an electric charge potential from the energy storage cell in reference to the common contact layer;
   a charge contact layer (150) adjacent the dielectric layer to apply an electric charge potential in reference to the common contact layer;
   a plurality of photo ionizing LEDs (160) coupled to a surface of an LED contact layer (170) and having their emissive apertures optically coupled to the energy storage cell,
   wherein the LED contact layer is coupled to the plurality of photo ionizing LEDs to supply a drive potential in reference to the common contact layer, and
   wherein a combined energy charge is supplied to generate an electric field, coupled through the charge contact layer, and to generate a photonic field, coupled through the LED contact layer, to generate a total charge energy that is supplied to the energy storage cell.

* * * * *